United States Patent
Matsuoka et al.

(10) Patent No.: US 6,602,736 B1
(45) Date of Patent: Aug. 5, 2003

(54) METHOD AND APPARATUS FOR SEPARATING SEMICONDUCTOR CHIPS

(75) Inventors: Makoto Matsuoka, Hatano (JP); Hitoshi Odashima, Yokohama (JP); Kazuyuki Futagi, Yokohama (JP); Syoji Nakakuki, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/534,521

(22) Filed: Mar. 24, 2000

Related U.S. Application Data

(63) Continuation-in-part of application No. 09/516,504, filed on Mar. 1, 2000, now Pat. No. 6,297,075.

(30) Foreign Application Priority Data

Mar. 3, 1999 (JP) .......................................... 11-005608
Mar. 26, 1999 (JP) .......................................... 11-083070

(51) Int. Cl.⁷ ........................ H01L 21/48; H01L 21/46; H01L 21/301
(52) U.S. Cl. ...................... 438/113; 438/460; 438/458; 257/783
(58) Field of Search ................................ 438/460, 462, 438/464, 106, 110, 118, 33, 68, 113, 458; 451/907; 257/753, 783; 460/89

(56) References Cited

U.S. PATENT DOCUMENTS

| | | | | |
|---|---|---|---|---|
| 4,722,130 A | * | 2/1988 | Kimura et al. ................. 29/413 |
| 5,765,277 A | * | 6/1998 | Jin et al. ....................... 29/743 |
| 5,888,883 A | * | 3/1999 | Sasaki et al. ................ 438/460 |
| 5,904,548 A | * | 5/1999 | Orcutt | |
| 6,245,593 B1 | * | 6/2001 | Yoshihara et al. ........... 438/106 |

FOREIGN PATENT DOCUMENTS

| JP | 1-264236 | 10/1989 |
|---|---|---|
| JP | 6-97214 | 4/1994 |
| JP | 6-295930 | 10/1994 |

* cited by examiner

*Primary Examiner*—Matthew Smith
*Assistant Examiner*—Calvin Lee
(74) *Attorney, Agent, or Firm*—Antonelli, Terry, Stout & Kraus, LLp

(57) ABSTRACT

In an apparatus for separating semiconductor chips, a semiconductor wafer stuck to an adhesive sheet with its silicon mirror surface facing downwards is sucked as a whole through its circuit surface side by means of a sucker plate capable of sucking the whole of wafer. In order to separate the sheet from a frame fixing the sheet while the sheet being sucked, the sheet is cut by a cutter edge so as to be separated from the frame. To separate the sheet from the wafer, the wafer top surface is guided by a guide plate having a tip angle of 15° and by causing the sheet to profile the tip of the guide plate, the sheet is peeled off in a direction making an angle of 45° to the dicing direction on the wafer.

13 Claims, 5 Drawing Sheets

FIG.5
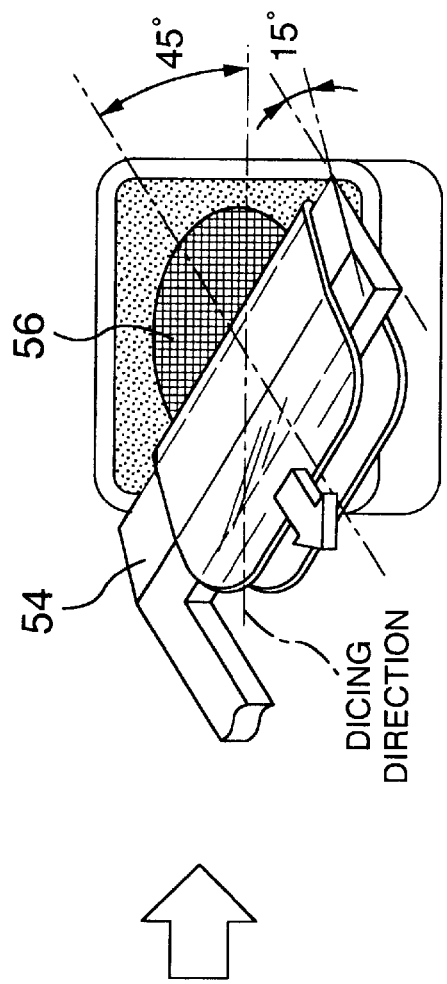
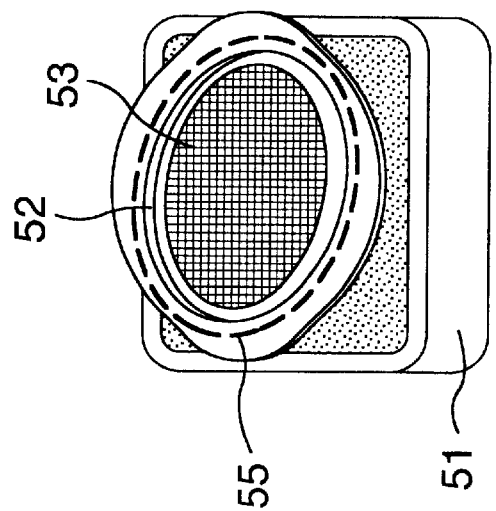

METHOD AND APPARATUS FOR SEPARATING SEMICONDUCTOR CHIPS

The present application is a continuation-in-part application of pending U.S. application Ser. No. 09/516,504 filed on Mar. 1, 2000, U.S. Pat. No. 6,297,075 entitled "Method and Apparatus for Separating Semiconductor Elements, and Mounting Method of Semiconductor Elements" by Hitoshi Odajima, Kazuyuki Futagi and Makoto Matsuoka, based on Japanese Patent Application No. 11-5608 filed on Mar. 3, 1999. The contents of that application are incorporated herein by reference.

BACKGROUND OF THE INVENTION

The present invention relates to method and apparatus for separating semiconductor chips in which semiconductor chips are separated from a sheet for fixing a semiconductor wafer with the aim of dicing the semiconductor wafer into units of semiconductor chips and individual semiconductor chips are picked up and moved to a different site so as to be stored thereat.

JP-A-6-295930 and JP-A-6-97214 are known as conventional techniques of dicing a semiconductor wafer stuck to an adhesive sheet into units of semiconductor chips and peeling off a diced semiconductor chip from the adhesive sheet to pick it up.

JP-A-6-295930 describes that sticking force applied to the semiconductor chip can be weakened by scraping the back of the adhesive sheet to which the semiconductor chip to be peeled off is stuck by means of a sliding pin and the semiconductor chip under the application of the weakened sticking force can be raised uniformly by lifting push-up pins, provided circumferentially of the sliding pin, together with the sliding pin, thereby ensuring that the semiconductor chip can be peeled off from the adhesive sheet.

JP-A-6-97214 describes that an adhesive sheet to which many pellets are stuck is fixedly held with the pellets facing downwards, a spherically formed lower end of a needle unit forms a press surface for the adhesive sheet, a needle having a sharp tip is pushed down from the needle unit to peel off a pellet from the adhesive sheet and the peeled-off pellet is sucked by the action of vacuum by means of an underlying collet.

Incidentally, JP-A-1-264236 is known as a conventional technique of dicing a semiconductor wafer stuck to an adhesive sheet into units of semiconductor chips.

JP-A-1-264236 describes a wafer break technique according to which an adhesive sheet is stuck to a frame ring, a semi-fully cut wafer is fixed by the adhesive sheet and semiconductor chips put together in the form of a wafer are cut off in units of chips by moving a roller swelled at central portion while pressing the roller against the back of the adhesive sheet.

SUMMARY OF THE INVENTION

An object of the present invention is to fabricate products of high quality by separating a group of semiconductor chips, which is diced into semiconductor chips while being stuck to an adhesive sheet, from the adhesive sheet without damaging the individual semiconductor chips.

Incidentally, a semiconductor chip packaged in a mobile product such as contactless IC card or portable telephone is required to be thin in order that the thickness of the product can be small and the packaging efficiency can be promoted. When the thin semiconductor chip as above is carried on a circuit board forming the mobile product such as contactless IC card or portable telephone to fabricate the above product, it is necessary to package the thin semiconductor chip without causing the chip to be damaged.

In the aforementioned JP-A-6-295930, however, the semiconductor chip is peeled off from the adhesive sheet by raising the push-up pins, provided circumferentially of the sliding pin, together with the sliding pin so as to uniformly lift the semiconductor chip and hence, the surface area of the semiconductor chip through which the chip is separated from the adhesive sheet is smaller than the surface area of the semiconductor chip through which the chip sticks to the adhesive sheet. Therefore, in the case of a thin semiconductor chip, there is great possibility that the chip fails to be separated and is broken.

In the aforementioned JP-A-6-97214, by lowering the needle having a sharp tip, the pellet is peeled off from the adhesive sheet. Accordingly, there is also great possibility of a thin semiconductor chip being prevented from separating out and being broken.

Besides, the aforementioned JP-A-1-264236 is concerned with the wafer break technique for cutting off semiconductor chips put together in the form of a wafer in units of chips.

As discussed above, neither of the aforementioned prior arts considers that when a thin semiconductor wafer stuck to the adhesive sheet is diced into units of thin semiconductor chips, a group of diced and aligned thin semiconductor chips is managed to be separated from the adhesive sheet without damaging the individual semiconductor chips.

According to the present invention, to solve the above problems, a thin semiconductor wafer stuck to an adhesive sheet is diced into units of thin semiconductor chips. Subsequently, a group of diced and aligned thin semiconductor chips is taken out by separating the adhesive sheet by means of a sucker plate without damaging the individual semiconductor chips. Through this, the present invention offers a method for separating semiconductor chips which can afford to fabricate products of high quality and a separating apparatus for implementing the method.

Namely, in the present invention, a semiconductor wafer stuck to an adhesive sheet with its silicon mirror surface facing downwards is sucked as a whole through its circuit surface side to a sucker plate which can suck the whole of wafer. In order to separate the sheet from a frame for fixing the sheet while the sheet being sucked, the sheet is cut by a cutter edge so as to be separated from the frame. To separate the sheet from the wafer, the wafer top surface is guided by a guide plate having a tip angle of 15° and by causing the sheet to profile the tip of the guide plate, the sheet is peeled off in a direction making an angle of 45° to the dicing direction on the wafer. The separating method and apparatus feature the above point.

Further, according to the semiconductor chip separating method and apparatus of the present invention, after the wafer is separated from the sheet through the aforementioned separating method, individual semiconductor chips are picked up independently of each other and transferred to a different site by means of a chip pick-up collet.

Advantageously, according to the invention, even a thin semiconductor wafer having a thickness of, for example, about 0.05 to 0.18 mm and a semiconductor wafer having an ordinary thickness of 0.4 to 0.5 mm can be diced into units of semiconductor chips while being stuck to the adhesive sheet and a group of diced and aligned semiconductor chips can be separated from the adhesive sheet by means of the sucker plate without damaging the individual semiconductor chips to permit fabrication of a high-quality mobile product such as contactless IC card and portable telephone.

BRIEF DESCRIPTION OF THE DRAWINGS

FIG. 5 is a diagram for explaining the tape peel-off operation.

DESCRIPTION OF THE EMBODIMENTS

Embodiments of the present invention will now be described with reference to the accompanying drawings.

Figure 4:
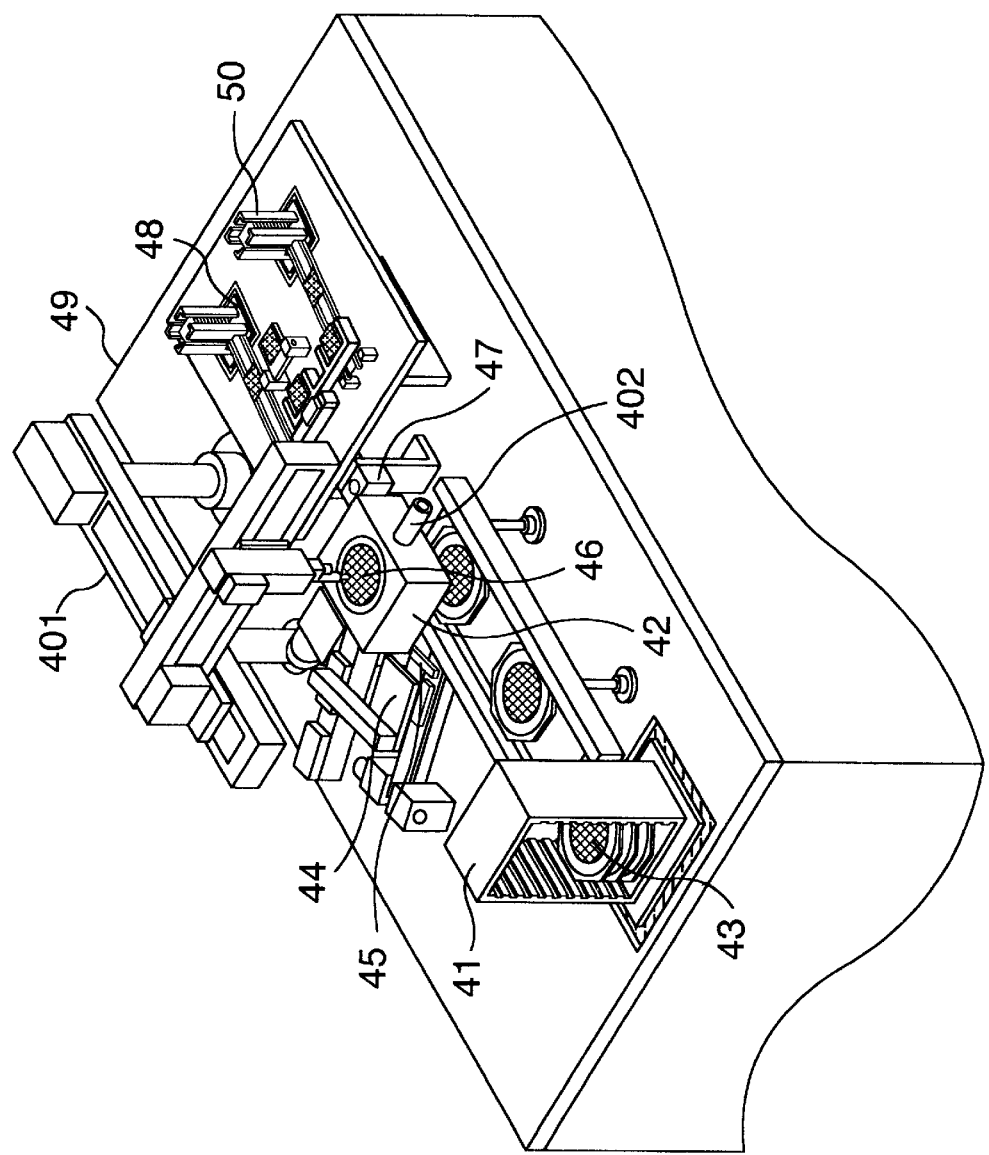
FIG. 4 is a perspective view of the whole of apparatus according to an embodiment of the invention.

Referring first to FIG. 4, the overall construction of an apparatus according to an embodiment of the invention will be described. Wafer rings 43 set in a wafer ring stocker 41 are conveyed one by one to a position where a sucker drum 42 is located, and the whole of wafer ring is sucked by the sucker drum 42. Under this condition, a sheet cutter underlying the sucker drum is raised to the level of the sucker drum 42 and is rotated at that level to cut a sheet. Thereafter, the sheet cutter is returned to its original lower position. After the sheet has been cut, only a set of part of the sheet and wafer is sucked to the sucker drum 42. Since the ring 43 is cut off from the sheet, the empty ring 43 is returned to the wafer ring stocker 41 through a convey path between the wafer ring stocker and the sucker drum.

Subsequently, a guide 44 and a sheet chuck 45 are moved to the position of the sucker drum 42 now sucking the sheet. The sheet chuck 45 chucks the edge of the sheet so that the sheet as a whole may creep along the guide 44 so as to be peeled off as shown in FIG. 5 (the guide is designated by reference numeral 54 in FIG. 5).

After the sheet has been peeled off, the sucker drum 42 is rotated through 180°. After the rotation, a camera carried on an XYZθ robot 401 detects an overall position of the wafer sucked to the sucker drum to carry out calculation for correcting the overall position and then, chips 46 are picked up by sucking one by one by means of a sucker nozzle carried on the XYZθ robot 401.

Each picked up chip 46 has a bad mark punched on a chip circuit surface and the bad mark is detected by a bad mark detector 47 in order that an acceptable chip is stored in a chip inversive jig 48. An unacceptable chip is discarded to a defective product collecting box disposed laterally of the bad mark detector. The operation for picking up chips is repeated until the chip inversive jig 48 is filled up with chips. When filled up, the chip inversive jig 48 now retaining chips 46 by sucking is 180° inverted to transfer the chips to an empty tray underlying the 180° inverted jig 48 in register therewith. When the transfer is completed, the inversive jig 48 recovers its original position and the tray carrying the transferred chips is conveyed to a tray stocker 49.

As the tray carrying the transferred chips is conveyed to the tray stocker 49, an empty tray is delivered from an empty tray stocker 50 and pick-up operation is carried out continuously until all chips in the wafer are exhausted.

It will be appreciated that the sucker drum 42 has two sucking surfaces and therefore, the tape peel-off operation is effected concurrently with the pick-up operation. Denoted by 402 is a suction port.

The embodiment of the invention will be described in greater detail with reference to the accompanying drawings.

Figure 1:
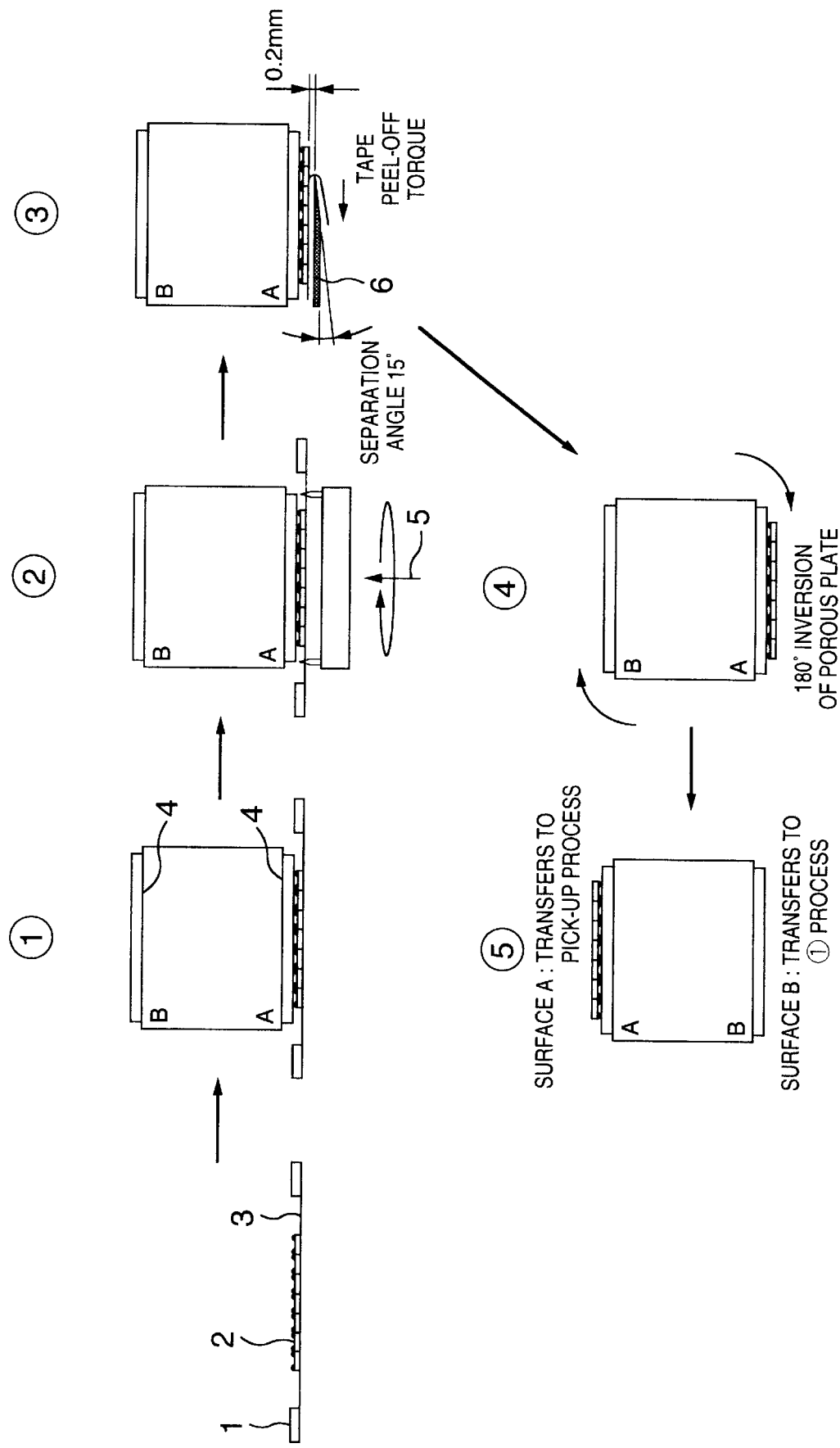
FIG. 1 is a diagram useful to explain method and mechanism for separating a wafer from a sheet according to the invention.

FIG. 1 is useful to explain method and mechanism for separating from a sheet a thin semiconductor wafer stuck to the sheet fixed to a frame.

In order to dice a thin wafer 2 to chip size, a dicing tape 3 is stuck to a ring 1 and the thin wafer 2 is stuck onto the dicing tape 3. The wafer is stuck with its device surface facing upwards and its silicon mirror surface facing downwards. The wafer is conveyed up to a position where a porous plate 4 is located.

The porous plate 4 has 15,500 perforations of, for example, 0.5 mm size arranged at a pitch of 1 mm and can cover the whole of 5-inch wafer. For example, by using a blower for 1300 lit./min suction, a suction force of 0.5 g/mm can be obtained. A support of the porous plate is equally worked at lower and upper surfaces A and B to permit a process for separating two wafers by means of a single mechanism.

Figure 2:
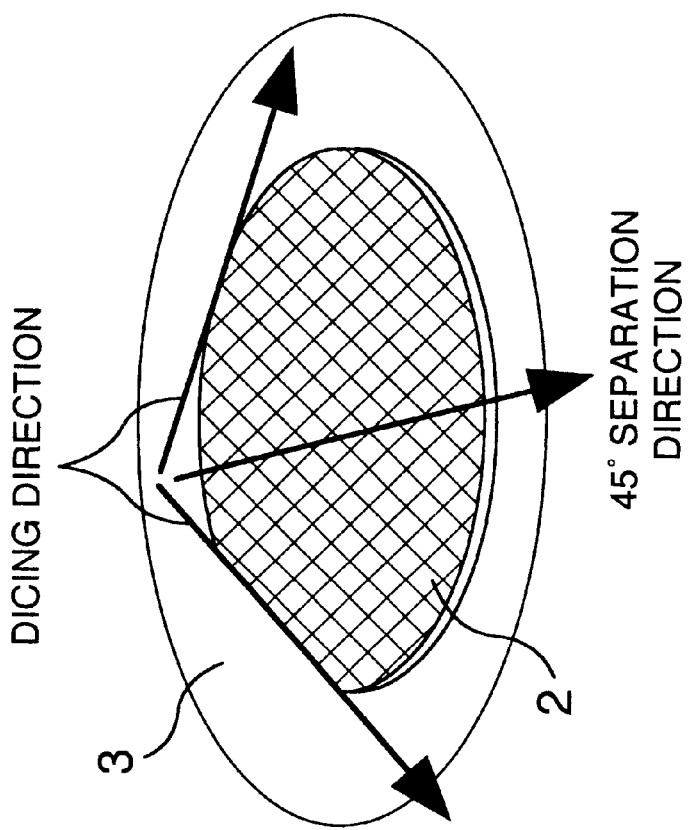
FIG. 2 is a diagram showing a direction in which the wafer is separated from the wafer in the invention.

After the wafer 2 has been conveyed to the position of the porous plate 4, the whole of device (circuit) surface of the wafer 2 is sucked by the action of the aforementioned suction force. Under this condition, a tape-cutter edge 5 underlying the porous plate 4 is raised and rotated to cut off the dicing tape 3 from the ring 1. After the cut off operation, the tape cutter edge is lowered and the ring 1 removed of the dicing tape 3 is saved to its original position. In order to separate the wafer 2 from the cut-off dicing tape 3, a guide plate 6 is moved up to the sucked wafer 2 and guides the tape at a level which is, for example, 0.2 mm distant from the top surface (now facing downwards) of the dicing tape. The tape is caused to profile a tip angle of, for example, 15° of the guide plate and the dicing tape 3 is pulled in a direction making an angle of about 45° to the separation direction while making the dicing tape 3 and guide plate 6 synchronous with each other as shown in FIG. 2, thereby separating the wafer 2 from the dicing tape 3. Torque for tape peel-off is, for example, 650 g.

The operation for separation of the wafer 2, more specifically, the tape peel-off operation, will be described in greater detail with reference to FIG. 5. A dicing tape 52 is sucked as a whole by the action of a porous plate 51 and the tape 52 is peeled off by causing the tape sheet to profile or creep along a guide 54 having a tip angle of 15° in a direction making an angle of 45° to the separation direction on a wafer 53. Denoted by 55 is a ring and by 56 is a chip.

Reverting to FIG. 1, the porous plate 4 carrying the wafer removed of the tape at the surface A is subsequently 180° rotated to be inverted. The wafer 2 at the surface A is brought into operation for picking up individual chips to be described below with reference to FIG. 3. While the surface A is subjected to the pick up operation, the separation process for wafer 2 can be effected concurrently at the B surface by starting suction of the whole of device (circuit) surface of another wafer 2.

Figure 3:
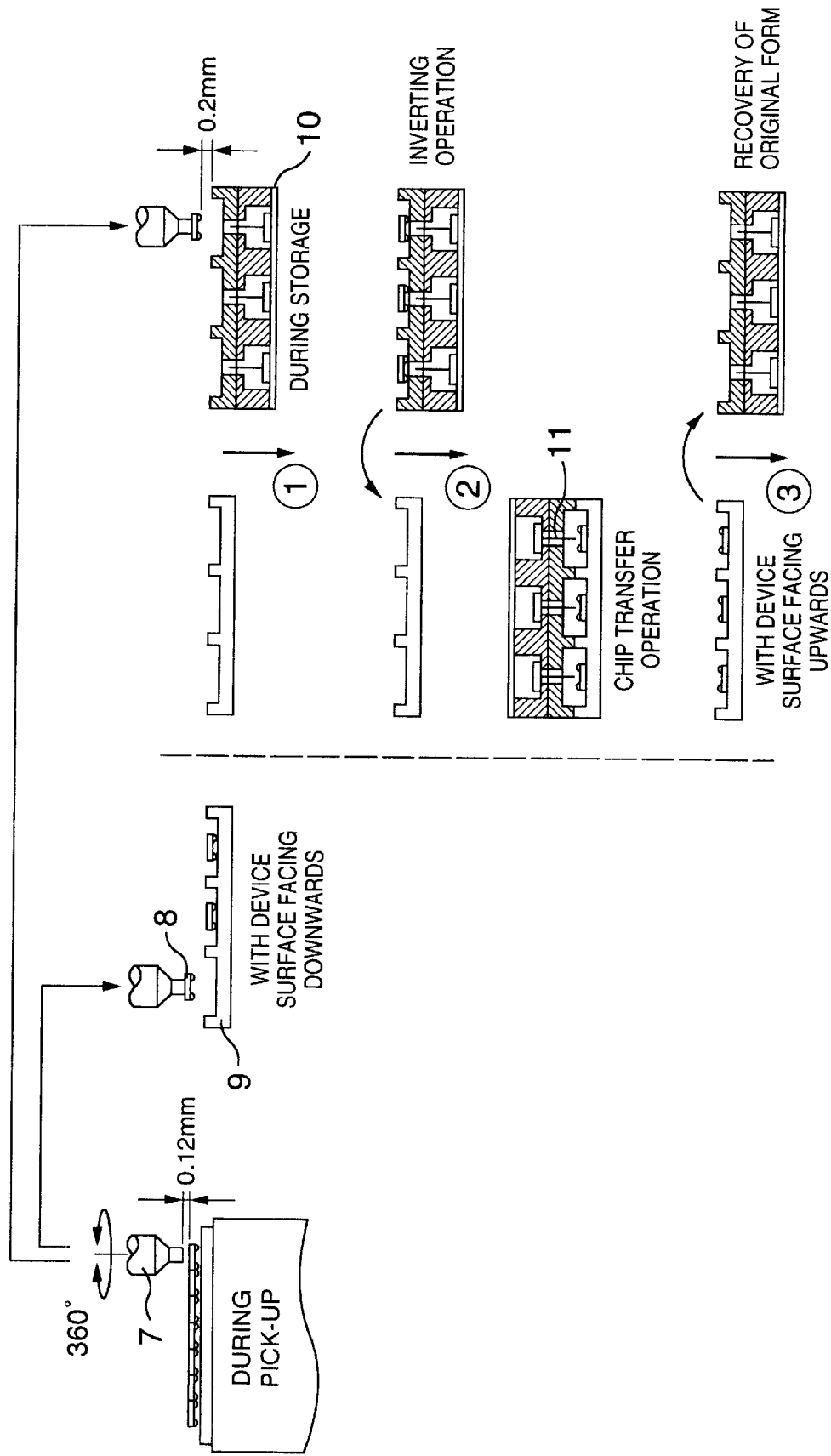
FIG. 3 is a diagram useful to explain method and mechanism for picking up a chip after separation of the wafer from the sheet and storing the chip in a tray according to the invention.

FIG. 3 is useful to explain the operation for picking up each chip after separation and storing it in a tray located at a different site.

Conceivably, after the wafer separation carried out through the method set forth above, various process operations (operation of directly picking up a chip and packaging it or operation of storing a chip in a tray serving as a buffer preceding packaging) can be taken depending on the nature of the succeeding step but in the present invention, storage to a tray is taken as will be described below.

By considering that a chip 8 should not be damaged by a chip sucker head 7 during pick-up operation, the chip sucker head 7 is lowered to a level which is 0.12 mm distant from the chip top surface and started to suck the chip 8. When the chip is desired to be stored with its device (circuit) surface facing downwards, the chip sucker head 7 is moved to a position of an ordinary tray 9 and is then lowered to a level which is 0.2 mm distant from the top surface of the tray to store the chip in the ordinary tray 9. The reason why the sucker head is only lowered to, for example, 0.2 mm above the tray is that the chip should not be damaged during storage. When a chip 8 is desired to be stored with its device (circuit) surface facing upwards, the chip 8 is moved up to a position of an inversive tray 10 and is stored in the tray 10 under the same condition for the storage in the ordinary tray 9. After the inversive tray 10 has been filled up with chips, the inversive tray 10 is raised, turned and lowered while retaining the stored chips by sucking and thereafter the chips 8 are pushed by means of pins 11 so as to be transferred to an ordinary tray 9. After the transfer, the inversive tray 10 is raised, turned and lowered so as to return to its original position.

Further, since the chip sucker head 7 is rotatable through 360°, the chip can be rotated at angular intervals of 90° so as to be stored at a 90° rotated position in the tray. During pick-up of chips 8 in FIG. 3, alignment or registration of the chip sucker head 7 with the individual semiconductor chips in the semiconductor wafer, that is, centering of the chip sucker head 7 on each chip 8 for the purpose of picking up each chip 8 at its center is carried out through a method to be described below.

More particularly, a camera for detection is installed on the drive shaft of the chip sucker head 7 to detect the position of a wafer 2 separated from the dicing tape 3 and retained on the porous plate 4 by sucking.

In this phase, since the wafer 2 is retained by sucking with its device (circuit) surface facing downwards, the mirror surface of silicon is detected. Basically, only dicing lines along which the wafer is diced can be targets of detection on the mirror surface, and so the dicing lines are detected for alignment.

Direct detection of the dicing lines presupposes that the wafer 2 is stuck to the ring 1 with a certain accuracy. In the event that the sticking accuracy cannot be warranted, a contrived method may be employed in which chips for test at a predetermined positions are drawn out at two diagonally spaced sites and drawn-out traces in the chip are detected. This latter method needs man-hour for draw-out but in case the sticking accuracy is not warranted, it is very effective.

What is claimed is:

1. A method for separating semiconductor chips, comprising:

positioning a sheet, to which a wafer diced into many semiconductor chips is stuck and which has its edge surrounded and supported by a frame, to a position where a sucker plate is located;

sucking said wafer to said sucker plate;

cutting said sheet to cut off, from said frame, a part of said sheet including a site where said wafer is stuck to said sheet;

separating said sheet from said wafer while said wafer is being sucked to said sucker plate, wherein said sheet is separated by pulling the edge of said sheet in a predetermined direction while said sheet is being moved under a guidance of a wedge-shaped guide, said wedge-shaped guide being moved in a direction making an angle of about 45° to the dicing line for chips on said wafer and concurrently therewith said sheet being pulled in the 45° direction, said sheet being caused to profile an angle of 15° of said wedge-shaped guide so as to be pulled in a direction making an angle of about 15° to the top surface of said sucker plate; and picking up the individual semiconductor chips, transferring them from said sucker plate to a different site and storing them in a tray.

2. A method for separating an adhesive sheet from a wafer comprising:

providing a wafer having one surface stuck to an adhesive sheet supported by a frame, said wafer being diced into many semiconductor chips;

arranging said wafer by positioning said wafer with respect to a sucking mechanism;

sucking an opposite surface of said one surface of said wafer by said sucking mechanism;

arranging a guide member having a wedge-shaped tip portion with respect to said adhesive sheet, said sheet being stuck to said one surface of said wafer;

making said adhesive sheet profile said tip portion of said guide member by holding one end of said adhesive sheet;

pulling said one end of said adhesive sheet while making said adhesive sheet profile said tip portion of said guide member and concurrently moving said guide member along said adhesive sheet; and separating said adhesive sheet from said one surface of said wafer.

3. A method according to claim 2 wherein:

said arranging said guide member with respect to said adhesive sheet includes providing said guide member having the wedge-shaped tip portion of about 15°, and positioning said guide member with respect to said adhesive sheet, and said pulling said one end of said adhesive sheet includes bending said adhesive sheet while making said adhesive sheet to profile said tip portion of said guide member, and pulling said one end of said adhesive sheet in a direction of about 15° with respect to a surface of said adhesive sheet.

4. A method according to claim 2 wherein:

said arranging said guide member with respect to said adhesive sheet includes positioning said guide member with respect to said adhesive sheet so that the tip of said guide member faces obliquely with respect to a dicing line of said wafer.

5. A method according to claim 2 wherein:

said arranging said guide member with respect to said adhesive sheet includes positioning said guide member with respect to said adhesive sheet so that the tip of said guide member forms an angle of about 45° with respect to a dicing line of said wafer.

6. A method according to claim 2 wherein:

said holding the one end of said adhesive sheet includes holding an arbitrary end of said adhesive sheet positioned in a direction of about 45° with respect to a dicing line of said wafer and making said adhesive sheet to profile said tip portion of said guide member, and said pulling said one end of said adhesive sheet includes pulling said arbitrary end towards a direction of 45° with respect to a dicing line of said wafer and concurrently moving said guide member.

7. A method of separating semiconductor chips from a wafer comprising:

providing a wafer having one surface stuck to an adhesive sheet supported by a frame, said wafer being diced into many semiconductor chips;

arranging said wafer by positioning said wafer with respect to a first sucking mechanism;

sucking an opposite surface of said one surface of said wafer by said first sucking mechanism;

arranging a guide member having a wedge-shaped tip portion by positioning said guide member with respect to said adhesive sheet, said adhesive sheet being stuck to said one surface of said wafer, making said adhesive sheet to profile said tip portion of said guide member by holding one end of said adhesive sheet;

pulling said one end of said adhesive sheet while making said adhesive sheet to profile said tip portion of said guide member and concurrently moving said guide member along said adhesive sheet;

separating said adhesive sheet from said one surface of said wafer;

arranging a second sucking mechanism by positioning said second sucking mechanism with respect to each of said semiconductor chips of said wafer;

picking up said each of said semiconductor chips from said wafer by said second sucking mechanism; and storing said picked-up each of said semiconductor chips in a storing tray.

8. A method according to claim 7 wherein:

said sucking said wafer by said first sucking mechanism includes sucking said opposite surface from an upper position of said opposite surface, and said arranging said second sucking includes inverting said first sucking mechanism while sucking said opposite surface of said wafer by said first mechanism, and arranging said second sucking mechanism at a position above said one surface of said wafer.

9. A method according to claim 7 wherein:

said arranging said guide member with respect to said adhesive sheet includes providing said guide member having said tip portion of a wedge shape of about 15°, and positioning said guide member with respect to said adhesive sheet, and said pulling said one end of said adhesive sheet includes bending said adhesive sheet while making said adhesive sheet to profile said tip portion of said guide member, and pulling said one end of said adhesive sheet in a direction of about 15° with respect to a surface of said adhesive sheet.

10. A method according to claim 7 wherein:

said arranging said guide member with respect to said adhesive sheet includes positioning said guide member with respect to said adhesive sheet so that said tip of said guide member faces towards an oblique direction with respect to a dicing line of said wafer.

11. A method according to claim 7 wherein:

said arranging said guide member with respect to said adhesive sheet includes positioning said guide member with respect to said adhesive sheet so that the tip of said guide member forms an angle of about 45° with respect to a dicing line of said wafer.

12. A method according to claim 7 wherein:

said holding the one end of said adhesive sheet includes holding an arbitrary end of said adhesive sheet positioned in a direction of about 45° with respect to a dicing line of said wafer and making said adhesive sheet to profile said tip portion of said guide member, and said pulling said one end of said adhesive sheet includes pulling said arbitrary end towards a direction of 45° with respect to a dicing line of said wafer and concurrently moving said guide member.

13. A method of separating semiconductor chips from a wafer comprising:

providing a wafer having a mirror surface stuck to an adhesive sheet supported by a frame, said wafer being diced into many semiconductor chips;

arranging below a first sucking mechanism said wafer with said mirror surface facing downward;

sucking a device surface of said wafer from an upper side of said wafer by said first sucking mechanism;

arranging said guide member having a wedge-shaped tip portion by positioning said guide member with respect to said adhesive sheet which is stuck to said mirror surface of said wafer;

making said adhesive sheet to profile said tip portion of said guide member by holding one end of said adhesive sheet;

pulling said one end of said adhesive sheet while making said adhesive sheet to profile said tip portion of said guide member and concurrently moving said guide member along said adhesive sheet;

separating said adhesive sheet from said mirror surface of said wafer;

inverting said first sucking mechanism while sucking said device surface of said wafer by said first sucking mechanism;

arranging a second sucking mechanism by positioning said second sucking mechanism with respect to each of the semiconductor chips of said wafer, said wafer being sucked by said first sucking mechanism with said mirror surface positioned at an upper side of said wafer;

picking up each of the semiconductor chips from said wafer by said second sucking mechanism; and storing the picked-up each semiconductor chip in a storing tray.

* * * * *